United States Patent
Klein et al.

(10) Patent No.: US 8,148,191 B2
(45) Date of Patent: Apr. 3, 2012

(54) COMBINED ETCHING AND DOPING MEDIA

(75) Inventors: Sylke Klein, Roβdorf (DE); Armin Kübelbeck, Bensheim (DE); Werner Stockum, Reinheim (DE); Wilfried Schmidt, Schwaigern (DE); Berthold Schum, Biebergmünd (DE)

(73) Assignee: Merck Patent GmbH, Darmstadt (DE)

( * ) Notice: Subject to any disclaimer, the term of this patent is extended or adjusted under 35 U.S.C. 154(b) by 606 days.

(21) Appl. No.: 12/246,516

(22) Filed: Oct. 7, 2008

(65) Prior Publication Data

US 2009/0071540 A1 Mar. 19, 2009

Related U.S. Application Data

(62) Division of application No. 10/492,308, filed as application No. PCT/EP02/10264 on Sep. 13, 2002, now Pat. No. 7,629,257.

(30) Foreign Application Priority Data

Oct. 10, 2001 (DE) .................. 101 50 040

(51) Int. Cl.
*H01L 21/00* (2006.01)
*H01L 31/00* (2006.01)
*H01L 31/18* (2006.01)

(52) U.S. Cl. ............... 438/72; 216/83; 257/E31.127

(58) Field of Classification Search .............. 216/83; 438/72; 136/261; 257/E31.127

See application file for complete search history.

(56) References Cited

U.S. PATENT DOCUMENTS

| | | | |
|---|---|---|---|
| 283,423 A | 8/1883 | Schtjlze-Bebge | |
| 1,470,772 A | 10/1923 | Leo | |
| 2,067,925 A | 1/1937 | Clayton | |
| 2,903,345 A | 9/1959 | Howard et al. | |
| 3,810,784 A | 5/1974 | Hill et al. | |
| 3,944,447 A * | 3/1976 | Magdo et al. | ........ 438/408 |
| 4,091,169 A | 5/1978 | Bohg et al. | |
| 4,108,704 A | 8/1978 | Horne | |
| 4,348,255 A | 9/1982 | Schmidtt | |
| 4,376,673 A | 3/1983 | Cheung | |
| 4,578,407 A | 3/1986 | Amabile et al. | |
| 4,781,792 A | 11/1988 | Hogan | |
| 4,891,325 A | 1/1990 | Hezel et al. | |
| 4,921,626 A | 5/1990 | Rhodenbaugh | |
| 5,688,366 A * | 11/1997 | Ichinose et al. | ........ 438/754 |

(Continued)

FOREIGN PATENT DOCUMENTS

DE 153360 1/1982

(Continued)

OTHER PUBLICATIONS

K. Coates, 166th European Photovoltaic Solar Energy Conference, Galsgow, p. 1279, (2000).

(Continued)

*Primary Examiner* — Nadine G Norton
*Assistant Examiner* — Mahmoud Dahimene
(74) *Attorney, Agent, or Firm* — Millen, White, Zelano, Branigan, P.C.

(57) ABSTRACT

The present invention relates firstly to HF/fluoride-free etching and doping media which are suitable both for the etching of inorganic layers and also for the doping of underlying layers. The present invention secondly also relates to a process in which these media are employed.

10 Claims, 4 Drawing Sheets

U.S. PATENT DOCUMENTS

| | | | |
|---|---|---|---|
| 5,871,591 | A * | 2/1999 | Ruby et al. .............. 136/261 |
| 6,066,267 | A | 5/2000 | Rath |
| 6,084,175 | A | 7/2000 | Perry |
| 6,337,029 | B1 | 1/2002 | Hardy et al. |
| 6,552,414 | B1 | 4/2003 | Horzel et al. |
| 6,670,281 | B2 | 12/2003 | Luly et al. |
| 6,695,903 | B1 | 2/2004 | Kubelbeck et al. |

FOREIGN PATENT DOCUMENTS

| | | |
|---|---|---|
| DE | 3725346 | 2/1989 |
| DE | 19910816 | 10/2000 |
| EP | 22915 | 1/1981 |
| JP | 58088142 | 5/1983 |
| WO | WO 9830652 | 7/1998 |
| WO | WO 0040518 | 7/2000 |
| WO | WO 0183391 | 11/2001 |

OTHER PUBLICATIONS

Definition of "Starch, modified." From Hawley's Condensed Chemical Dictionary, 14th Ed, Obtained from http://www.knovel.com on Jan. 22, 2006.

Difinition of "glass, plate." From Hawley's Condensed Chemical Dictionary, 14th Edition Sons, Inc. Obtained from http://www.knovel.com on Feb. 3, 2005.

"A review of the chemical reaction machanism and kinetics for hydrofluoric acid etching of silicon dioxide for surface micromachining applications", David J. Monk et al., D. J. Monk et al. / Chemical reaction mechanism in HF etching of $SiO_2$, pp. 1-12, (1993).

"Silicon dioxide sacrificial layer etching in surface micromachining", J. Bohler et al., J. Microeng. 7 (1997), pp. R1-R13.

Tang O et al., "Column technology for capillary electrochromatography," TRAC, Trends in Analytical Chemistry, Nov. 2000, pp. 648-663.

"Xantham gum." Chaplin, Martin. Retrieved from http://www.martin.chaplin.btinternet.co.uk/hyxan.html/ on Aug. 31, 2004.

Product description of KELZAN(lm). Retrieved from http://www.cpkelco.com/xanthan/industrial/index.html/ on Sep. 2, 2004.

"Dissociation Conslanls of inorganic Acids and Bases." CRC Handbook of Chemistry and Physics, 84th ed. 2003-2004, Retrieved Aug. 31, 2004 from http://www.hbcpnetbase.com/.

English Abstract of JP-06065544-A. From Patent Abstracts of Japan. vol. 018, No. 313 (C-1212), Jun. 15, 1994.

van Gelder et al: The etching of Silicon Nitride in Phosphoric Acid with Silicon Dioxide as a Mask., Journal Electrochemical S. 114 (8), 869 (1987).

* cited by examiner

COMBINED ETCHING AND DOPING MEDIA

This application is a divisional of U.S. Ser. No. 10/492,308 (U.S. Pat. No. 7,629,257), filed Apr. 12, 2004, which is a 371 national stage entry of PCT/EP02/10264 filed on Sep. 13, 2002.

The present invention relates firstly to HF/fluoride-free etching and doping media which are suitable both for the etching of inorganic layers and also for the doping of underlying layers. The present invention secondly also relates to a process in which these media are employed.

The term "solar cell" below is defined as being mono- and multicrystalline silicon solar cells, independently of solar-cell types based on other materials.

The action of a solar cell is based on the photoelectric effect, i.e. on the conversion of photon energy into electrical energy.

For silicon solar cells, pre-doped silicon base material (usually p-doped Si, area 1 in FIG. 1) is to this end doped with opposite charge carriers of different name (for example phosphorus doping results in $n^+$ conduction), i.e. a p-n transition is generated.

On introduction of photon energy into the solar cell (sunlight), charge carriers are generated at this p-n transition, which results in a broadening of the space charge region and an increase in voltage. The voltage is tapped by contacting the solar cell, and the solar current is directed to the consumer.

The typical process sequence for the production of solar cells consists in simplified form of:
1. Texturing of the front of the p-doped Si plates
2. $n^+$ doping (usually with phosphorus)
3. Etching of the PSG (phosphorus-silicate glass)
4. Passivation/antireflection coating with silicon oxide or silicon nitride layers
5. Metallisation of front and back Further consideration of the invention requires more detailed description of step 4.

In some—from the historical point of view—older production processes, the passivation layer is achieved through the formation of a thermally generated $SiO_2$ layer [A. Goetzberger, B. Voβ, J. Knobloch, Sonnenenergie: Photovoltaik, p. 109]. The functioning consists in the majority of the unsaturated bonds on the Si surface being saturated and rendered ineffective there. The flaw density and recombination rate are thus lowered. In addition, setting of the $SiO_2$ layer thickness to about 100 nm ($=\lambda/4$ rule) produces a reflection-reducing surface.

The literature furthermore discloses coating with $TiO_2$ layers, which, although exhibiting only a small passivation effect, can make a significant contribution to reflection reduction in a solar cell owing to the higher refractive index [A. Goetzberger, B. Voβ, J. Knobloch, Sonnenenergie: Photovoltaik, p. 134].

For the production of highly efficient solar cells, the use of silicon nitride layers as passivation layer has proven particularly advantageous in practice. The excellent passivation properties are known from semiconductor technology, for example as barrier or passivation layers in integrated circuits, FETs, capacitors, etc.

For use in the production of solar cells, in particular for the volume passivation of multicrystalline silicon, silicon nitride having a high hydrogen content of $2.8 \times 10^{22}$ $cm^{-3}$ is applied to the back of the cell. At 820° C., the hydrogen diffuses into the volume and thus increases the minority life. For emitter passivation, silicon nitride is conditioned at 625° C. in a forming-gas atmosphere and results in an improvement in the spectral sensitivity in the UV range.

Besides its good passivation behaviour, silicon nitride has excellent antireflection properties. The refractive index of the silicon nitride layers produced in the plasma (PECVD) covers a broad range of n=1.6-2.7 compared with silicon oxide with n=1.4-1.5. In addition, light absorption by silicon nitride in the visible region is very low [R. Hezel, Gmelin Handbook, Sci. Suppl. Vol. B 5c, p. 321].

These layers are usually produced in a layer thickness of about 70 nm by plasma-enhanced or low-pressure CVD processes (PECVD or LPCVD respectively) from, for example, silane and ammonia. In the layer-thickness range selected, reflection-reducing layers in the $\lambda/4$ region are produced in addition to the excellent low surface recombination rates [A. Goetzberger, B. Voβ, J. Knobloch, Sonnenenergie: Photovoltaik, p. 110; A. Ehrhardt, W. Wettling, A. Bett, J. Appl. Phys. A53, 1991, p. 123]. This process is described in greater detail in U.S. Pat. No. 4,751,191.

According to the state of the art, coating of a monocrystalline or multicrystalline solar cell with silicon nitride represents the best process for surface passivation and reflection reduction. It is now employed in mass production in more recent production lines.

For increasing the efficiency, it has proven advantageous in laboratory experiments to dope the regions beneath the contacts on the emitter side to a greater extent than the surrounding $n^+$ region, i.e. to carry out an $n^{++}$ diffusion with phosphorus. These structures are known as selective or two-stage emitters [A. Goetzberger, B. Voβ, J. Knobloch, Sonnenenergie: Photovoltaik, p. 115, p. 141]. The doping here is in the order of $10^{18}$ $cm^{-3}$ in the $n^+$ region and in the region of about $10^{20}$ $cm^{-3}$ in the $n^{++}$ region. Efficiencies of up to 24% are achieved on a laboratory scale with highly efficient solar cells of this type.

A number of processes are described in the literature for obtaining these regions with varying degrees of doping for the selective emitter, all these processes being based on a structuring step. In this, mostly using photolithographic methods, apertures (in layer 2, FIG. 2) which enable local doping ($n^{++}$) are introduced in a targeted manner into $SiO_2$ layers (layer 2 in FIG. 1)—which prevent doping of the underlying silicon in the vapour phase. This doping is usually carried out in the gas phase using $POCl_3$ or $PH_3$ (layer 3 in FIG. 3). The doping windows are etched into the $SiO_2$ using hydrofluoric acid or buffered hydrofluoric acid (FIG. 2).

After the $n^{++}$ doping (layer 3 in FIG. 3), the $SiO_2$ mask is removed completely again (FIG. 4), and the $n^+$ doping (layer 4 in FIG. 5) is carried out. Finally, the antireflection layer is deposited (layer 5 in FIG. 6).

Owing to the very complex and expensive procedure, these processes have not been implemented beyond the laboratory stage.

Another process is based on removing the $n^{++}$ regions by etching with an etching mixture comprising hydrofluoric acid and nitric acid with simultaneous masking of the later contact regions. This process has likewise been unable to establish itself in practice owing to its complex procedure.

A feature which is common to all these processes is that the passivation layer has to be opened locally using hydrofluoric acid or salts of hydrofluoric acid. In addition, doping in the gas phase has to be carried out after a rinsing and drying step.

Local opening of the $SiO_2$ or silicon nitride layer with the aid of an etching paste, as described in DE 10101926 or PCT/EP 01/03317/and subsequent doping in the gas phase with, for example, $POCl_3$, appears to be clearly superior to these processes.

It is known from the literature that silicon nitride can be etched selectively over $SiO_2$ by means of hot orthophosphoric acid [A. F. Bogenschütz, "Ätzpraxis für Halbleiter" [Etching Practice for Semiconductors], Carl Hanser Verlag Munich, 1967]. This is a widespread process in microelectronics. The phosphoric acid here is usually employed at temperatures of about 165° C., and the wafers are immersed into the acid bath. The etching rates in this temperature range are about 3 nm/min.

This process is not very suitable for the etching of silicon nitride layers on solar cells. The etching rates are too low for mass production, and furthermore the problem exists that complex photolithographic steps are still necessary for the structuring.

The object of the present invention is therefore to provide a suitable etching medium with the aid of which inorganic surfaces, in particular silicon nitride layers of solar cells, can be etched selectively at high etching rates. A further object of the present invention is to provide a process for the selective etching of inorganic surfaces for the production of selective emitter structures in solar cells which, besides etching, also enables targeted phosphorus doping for the production of $n^{++}$ regions.

The object is achieved by a process for the etching of passivation and antireflection layers of silicon nitride on solar cells, in which an etching medium comprising phosphoric acid or salts thereof is applied, in a single process step, over the entire surface or selectively to the surface regions to be etched, in particular by a process in which the silicon substrate provided with etching medium is heated over the entire surface or locally to temperatures in the range from 250 to 350° C. for from 30 to 120 seconds, and, if desired, for additional $n^{++}$ doping, subsequently heated to temperatures of >800° C., in particular to temperatures in the range from 800 to 1050° C., for from 20 to 40 minutes.

The present invention thus relates to a process for the etching of passivation and antireflection layers of silicon nitride on solar cells, characterised in that an etching medium comprising phosphoric acid or salts thereof is applied, in a single process step, over the entire surface or selectively to the surface regions to be etched wherein the silicon substrate provided with etching medium is heated over the entire surface or locally to temperatures in the range from 250 to 350° C. for from 30 to 120 seconds, and, if desired, for additional $n^{++}$ doping, subsequently heated to temperatures of >800° C., in particular to temperatures in the range from 800 to 1050° C., for from 20 to 40 minutes and its particular embodiment according to the claims and described herein. The invention likewise relates to a novel etching medium for the etching of inorganic passivation and anti-reflection layers on solar cells, comprising, as active component, ortho-, meta- or pyrophosphoric acid, and/or meta-phosphorus pentoxide or mixtures thereof, which acts both as etching component and as doping component. The medium comprises one or more ammonium salt(s) of phosphoric acid and/or mono-or diesters of a phosphoric acid, which liberate the etching phosphoric acid through thermal input of energy. The medium is in the form of a paste which comprises, in addition to an etching and doping component, solvents, thickeners and optionally additives, such as antifoams, thixotropy agents, flow-control agents, deaerators and adhesion promoters. The invention also relates to the use thereof in accordance with the claims. The present invention furthermore relates to solar cells produced by a process according to the claims.

The object according to the invention is achieved, in particular, by means of an etching medium in which the various forms of phosphoric acid or suitable phosphoric acid salts or compounds which are decomposed to the corresponding phosphoric acid on heating serve as etching component and, if desired, as doping component.

Experiments have shown that orthophosphoric acid, metaphosphoric acid, pyrophosphoric acid or salts thereof and here, in particular, the ammonium salts ($(NH_4)_2HPO_4$, $NH_4H_2PO_4$, $(NH_4)_3PO_4$) and other compounds which form one of these compounds on thermal decomposition are capable of removing silicon nitride layers with a layer thickness of 70 nm completely by etching within from a few seconds to minutes at temperatures above 250° C. At 300° C., the etching time is about 60 seconds.

By selective application, for example by screen printing, by the ink-jet process or other methods, and heating of the coated silicon substrate over the entire surface, local etching can, in addition, be carried out. The same can be achieved by complete coating, for example by spin coating, spray coating or other coating methods, and local heating, for example using an IR laser.

An advantage of this etching process is that the silicon nitride can be etched without the use of hydrofluoric acid or hydrofluoric acid salts, which are toxic and expensive to dispose of. In addition, the beginning and end of the etching can be controlled simply through the time and duration of the thermal excitation. A particular advantage is that, by means of a selectively printed-on phosphoric acid (ortho-, meta- or pyro-), or one of its salts or compounds, the same can be liberated, for example by thermal excitation, $n^{++}$ doping can be produced in a second, immediately subsequent process step, as is necessary in the case of the selective emitter. This doping process is known to the person skilled in the art and can be carried out, for example, as described in [A. Goetzberger, B. Voβ, J. Knobloch, Sonnenenergie: Photovoltaik, p. 115, p. 141].

The invention thus relates to the production of selective emitter structures through the use of combined HF/fluoride-free, printable etching and doping media.

The etching media used are HF/fluoride-free, easily handled mineral acids or salts and/or mixtures thereof, which may be in the form of a solution or paste.

The etching media present in solution are applied over the entire surface by a process which is generally known to the person skilled in the art, such as, for example, spin coating, spraying or dipping. In a second step, the phosphoric acid is excited to etch the silicon nitride layer by local heating, for example with the aid of a laser. In a further step, the phosphoric acid can, if desired, be heated locally to temperatures in the region >800° C., as is necessary for $n^{++}$ doping, using a second, more powerful laser. The use of an IR laser whose wavelength is not absorbed by the underlying silicon is particularly advantageous here in order to avoid crystal defects. If the process is carried out in an adroit manner, the etching and doping process can take place in a single step.

More favourable than coating over the entire surface is, however, selective coating of the silicon substrates with a paste-form mixture comprising phosphoric acid (possible layout, see FIG. 11). This can be carried out by printing processes known to the person skilled in the art, such as, for example, screen printing, stencil printing, stamp printing or pad printing. After application, the substrates are warmed in a subsequent step in order to initiate the silicon nitride etching. This can be carried out on a hotplate or by IR radiation or by another method for heating substrates which is known to the person skilled in the art. Examples thereof are heating by microwaves or heating in a convection oven. A temperature range of from 250 to 350° C. is advantageous for the etching. The etching duration for a PECVD silicon nitride layer with a thickness of 70 nm is about 60 seconds at 300° C. The heating of the substrate at temperatures >800° C., as is necessary for thermal $n^{++}$ doping with phosphorus, can be carried out in a further step immediately following the etching step. The diffusion profile of the phosphorus into the silicon can be controlled in the manner known to the person skilled in the art via the duration and temperature.

The etching and doping can advantageously be carried out here in a single temperature step by carrying out the process in an adroit manner.

This selective application of the etching and doping media is not only more favourable with respect to material consumption, but is also considerably quicker in throughput than the serial writing of an area using a laser.

In contrast to the above-mentioned printing processes, application by ink-jet printing and the dispenser method—both non-contact processes—may be mentioned as a further variant. This enables a warmed substrate to be printed and etched directly. Here too, simultaneous etching and doping is possible by carrying out the process in an adroit manner.

If the etching media used are pastes, these can likewise be applied over the entire surface or selectively to the areas to be doped.

If the pastes additionally comprise doping elements, such as phosphorus, they can serve as doping source after the actual etching step.

To this end, the solar cells are subjected to temperatures of 800-1000° C., during which the doping element present in the paste diffuses into and dopes the contact areas. All other paste components are volatile at these temperatures and burn without residues.

The paste is applied in a single process step to the desired areas of the surface to be etched. A method with a high degree of automation which is suitable for the transfer of the paste to the surface is printing. Screen printing, stencil printing, pad printing and stamp printing are processes which are known to the person skilled in the art.

All masking and lithography steps which are necessary for use of wet-chemical etching processes or selective doping in the gas phase, but also rinsing operations, are superfluous. In this way, time as well as materials can be saved in the process according to the invention. Furthermore, significantly smaller amounts of contaminated chemicals arise, have to be worked up again or disposed of.

A possible process sequence is shown in FIGS. 7-10. After conventional $n^+$ doping (layer 4 in FIG. 7) and silicon nitride deposition (as antireflection layer, layer 5 in FIG. 8), the wafer is printed selectively with the combined etching and doping paste described in accordance with the invention (layer 6 in FIG. 9). This firstly etches the silicon nitride layer selectively and can be forced into the silicon wafer with supply of energy, with the formation of the $n^{++}$ layer under the previously printed structures (layer 3 in FIG. 10).

Besides the etching and doping operation which takes place in a single process, it is advantageous that the regions to be contacted in a next step are already exposed. Electrochemical contacting can thus be carried out immediately, or metal pastes can be used which do not have to be fired in with high expenditure of energy.

The etching pastes according to the invention have the following composition:
a. Etching and optionally doping component
b. Solvent
c. Thickener
d. Optionally additives, such as antifoams, thixotropy agents, flow-control agents, deaerators, adhesion promoters The etching action of the etching pastes proposed is based on an acidic component which is effective through temperature excitation. This component comes from the group consisting of phosphoric acid (ortho, meta or pyro) and salts thereof, preferably ammonium salts ($(NH_4)_2HPO_4$, $NH_4H_2PO_4$, $(NH_4)_3PO_4$).

The etching component is present in a concentration range of 1-80% by weight, based on the total weight of the etching paste. The etching and removal rate of silicon nitride can be influenced significantly through the concentration of the etching component.

It has been found in further experiments that the addition of a strongly oxidising component, such as, for example, nitric acid or nitrates, enables the etching rate of phosphoric acid to be increased further.

The proportion of solvent can be in the range 20-80% by weight, based on the total weight of the etching paste. Suitable solvents can be pure inorganic or organic solvents or mixtures thereof such as water, monohydric and/or polyhydric alcohols, ethers, in particular ethylene glycol monobutyl ether, triethylene glycol monomethyl ether or [2,2-butoxy (ethoxy)]ethyl acetate.

The proportion of thickener, which is necessary for targeted setting of the viscosity range and fundamentally for achieving printability of the etching composition, i.e. for the formation of a printable paste, is in the range 1-20% by weight, based on the total weight of the etching paste.

The structural viscosity of the etching pastes described is achieved through network-forming thickeners which have a swelling action in the liquid phase, and can be varied depending on the desired area of application. Thickeners which can be used are organic or inorganic products or mixtures thereof:
- Cellulose/cellulose derivatives, such as ethyl-, hydroxypropyl-, hydroxyethyl- or sodium carboxymethylcellulose
- Starch/starch derivatives, such as sodium carboxymethylstarch (Vivastar®),
- Anionic heteropolysaccharides
- Acrylates (Borchigel®)
- Polymers, such as polyvinyl alcohols (Mowiol®), polyvinylpyrrolidone (PVP)
- Highly disperse silicic acids, such as Aerosil®

Inorganic thickeners, such as, for example, highly disperse silicic acid, remain on the substrate even during the subsequent doping step at >800° C., in contrast to the organic thickeners, and can thus be used to set the doping glass properties. Both types of thickener, organic and inorganic, can also be combined as desired.

Additives having advantageous properties for the desired purpose are antifoams, thixotropy agents, flow-control agents/antiflow agents, deaerators and adhesion promoters. It is readily possible for the person skilled in the art to select suitable additives which meet the valid requirements for the production of solar cells from the commercially available additives. Targeted addition of these additives enables the printability of the etching paste to be positively influenced.

In order to achieve high efficiencies in a solar cell, it is important that all starting materials for the preparation of the etching paste have adequate purity. In particular, the readily diffusing elements, such as, for example, copper, iron and sodium, which considerably shorten the carrier life in silicon, should be present in concentrations of <200 ppb.

In accordance with the invention, these novel etching and doping pastes can be employed in the solar-cell industry for the production of photovoltaic components, such as solar cells or photodiodes. In particular, the pastes according to the invention can be employed in a two-step process for the production of emitter structures.

FIG. 11 shows a layout of a structure etched on a silicon nitride surface which has been produced using an etching paste according to Example 2 according to the invention (photomicrograph, FIG. 12).

For better understanding and for clarification, examples are given below which are within the scope of protection of the present invention, but are not suitable for restricting the invention to these examples.

EXAMPLE 1

Preparation and Composition of the Paste 6 g of Aerosil 200 (Degussa-Huels AG) are stirred into 100 g of 85% orthophosphoric acid (Merck Art. 1.00573). The paste formed is stirred for a further 20 minutes using a propeller stirrer.

EXAMPLE 2

Preparation and Composition of the Paste

3% by weight of PVP K90 are stirred into a mixture consisting of 48.5% by weight of $H_3PO_4$ (85%) and 48.5% by weight of 1-methyl-2-pyrrolidone. The paste formed is stirred for a further 20 minutes using a propeller stirrer.

An etching paste prepared in the manner described is printed using a 120 T polyester screen in a commercially available screen-printing machine. The layout shown in FIG. 11 is imaged on the screen and transferred to the substrate. The substrate employed is a multicrystalline solar cell having a size of 100×100 mm with a silicon nitride passivation layer over the entire surface. Immediately after the printing, the substrate is heated at 300° C. on a hotplate for 100 seconds. The complete through-etching of the silicon nitride layer is evident visually after only about 60 seconds (FIG. 12). The substrate is then introduced into a diffusion oven with atmospheric air for 30 minutes at 850° C.

After removal of the phosphorus glass layer, local, high doping with phosphorus in the region of about $10^{20}$ cm$^{-3}$ can be detected.

BRIEF DESCRIPTION OF THE DRAWINGS

FIG. 1 shows pre-doped silicon base material layered with $SiO_2$.

FIG. 2 shows introduction of apertures.

FIG. 3 shows doping of the underlying layer through the apertures.

FIG. 4 shows removal of the $SiO_2$ mask.

FIG. 5 shows n$^+$ doping.

FIG. 6 shows depositing an antireflection layer.

FIG. 7 shows conventional n$^+$ doping.

FIG. 8 shows silicon nitride deposition as antireflection layer.

FIG. 9 shows selectively printing the wafer with a combined etching and doping paste.

FIG. 10 shows the formation of an n$^{++}$ layer under the previously printed structures.

Figure 1:
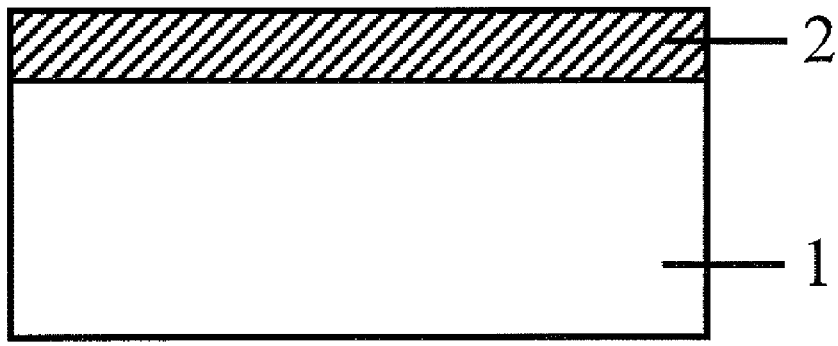
FIGS. 1-10 schematically show steps for etching of inorganic layers and for the doping of underlying layers according to the invention.
Figure 2:
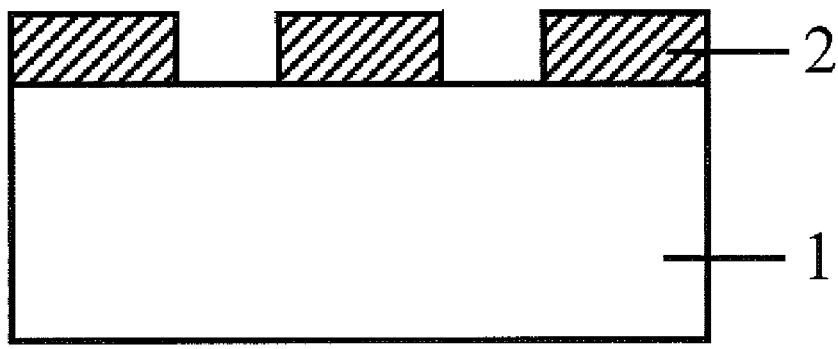
Figure 3:
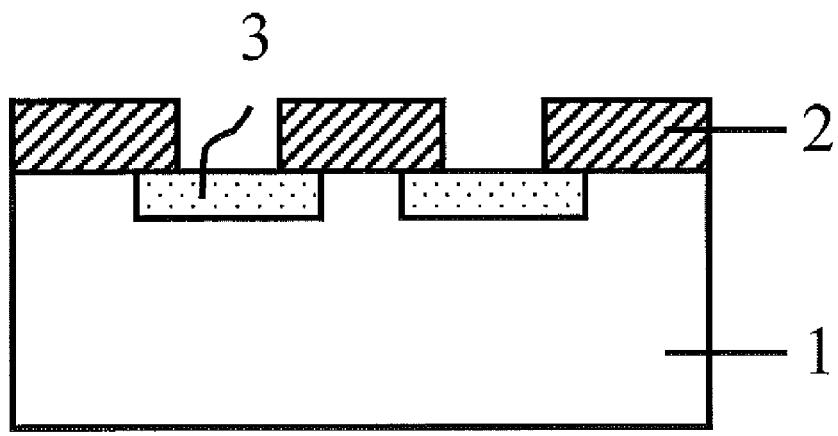
Figure 4:
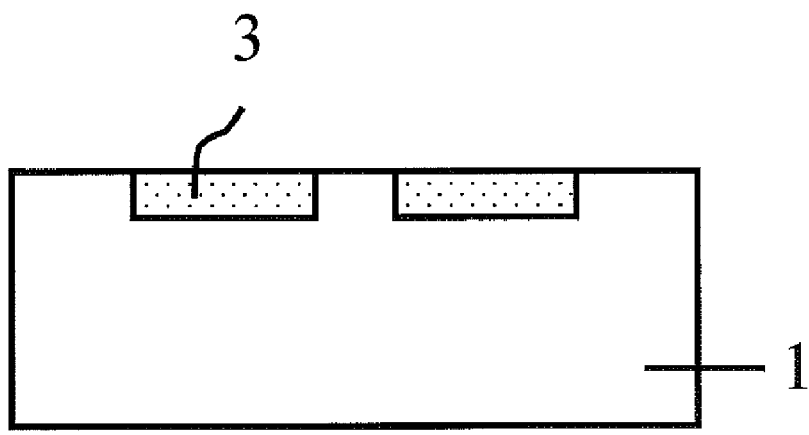
Figure 5:
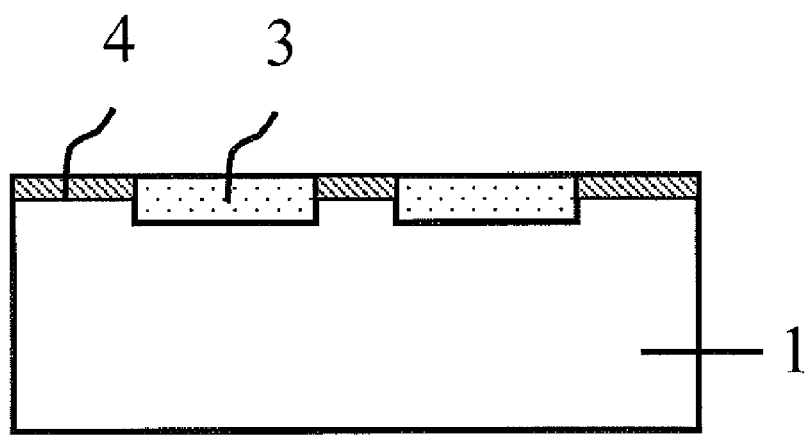
Figure 6:
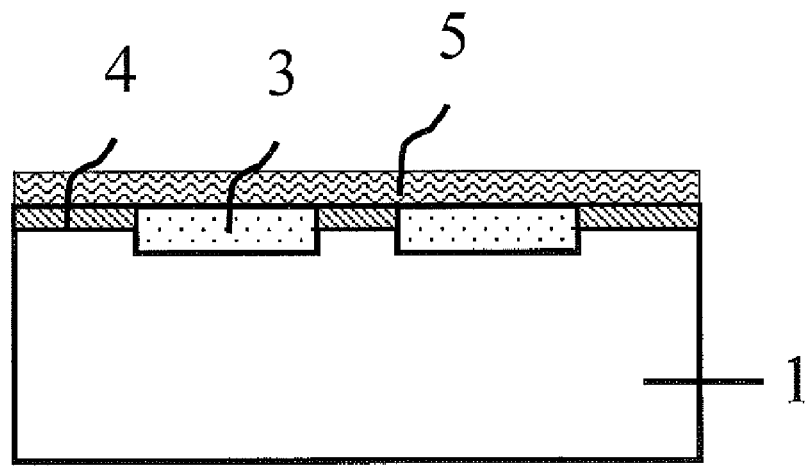
Figure 7:
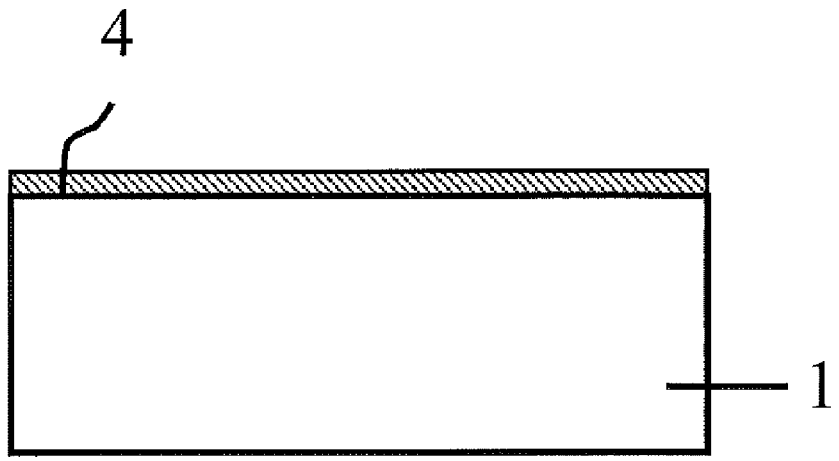
Figure 8:
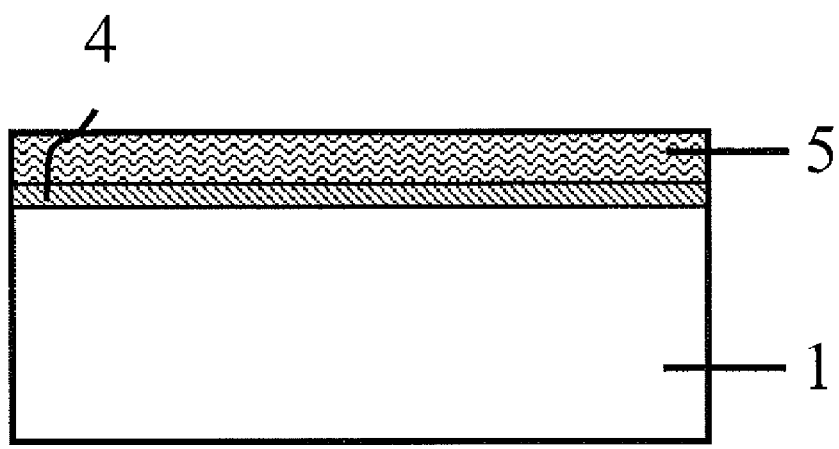
Figure 9:
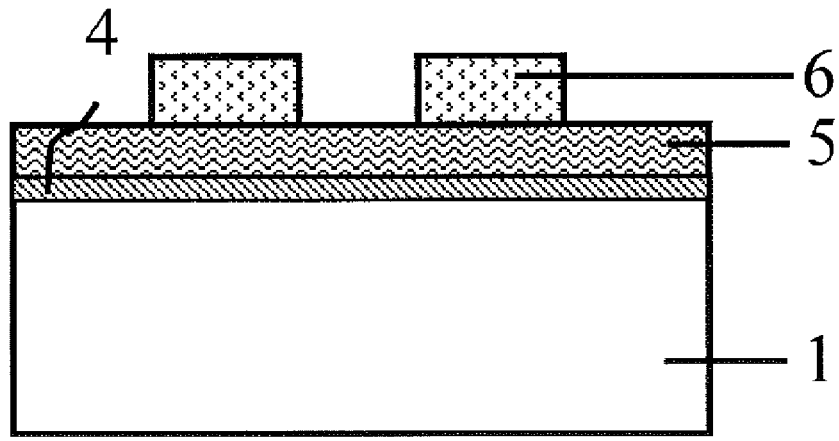
Figure 10:
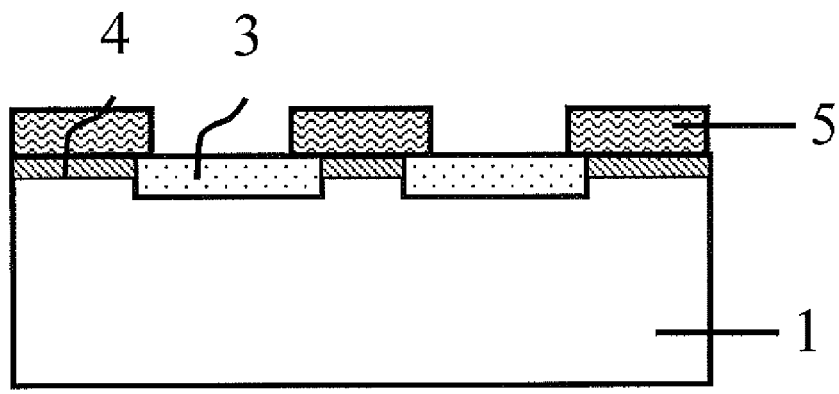
Figure 11:
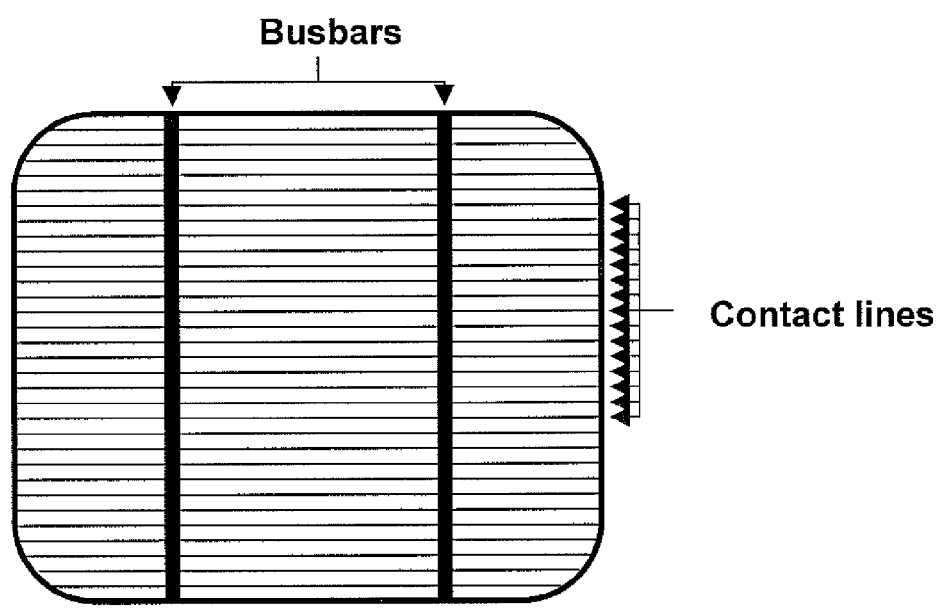
FIG. 11 shows a layout of a structure etched on a silicon nitride surface which has been produced using an etching paste according to Example 2 of the invention.
Figure 12:
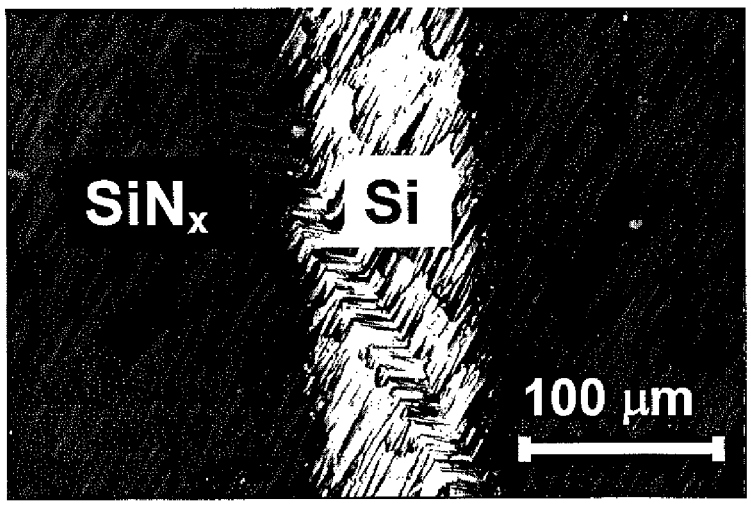
FIG. 12 shows a photomicrograph of the structure from FIG. 11.

The invention claimed is:

1. A process for the etching of passivation and antireflection layers of silicon nitride on solar cells, comprising
    (a) applying a printable paste-form etching medium comprising phosphoric acid or a salt thereof in a single process step, over the entire surface of said solar cell or selectively to the surface regions of said solar cell to be etched, and
    (b) heating the entire surface or the surface regions to be etched to 250 to 350° C. for from 30 to 120 seconds.

2. A process according to claim 1, comprising subsequently heating said entire surface of said solar cell or the surface regions of said solar cell to be etched to a temperature of >800° C. for from about 20 to 40 minutes to achieve n$^{++}$ doping.

3. A process according to claim 1, wherein said printable, paste-form etching medium comprises ethyl-, hydroxypropyl-, hydroxyethyl- or sodium carboxymethylcellulose, sodium carboxymethylstarch, an anionic heteropolysaccharide, an acrylate, a polyvinyl alcohol, polyvinylpyrrolidone (PVP) or a highly disperse silicic acid.

4. A process according to claim 1, wherein the etching medium is applied, depending on its consistency, by spraying, spin coating, dipping or by screen printing, template printing, stamp printing, pad printing or ink-jet printing or by the dispenser method.

5. A process according to claim 1, wherein the heating is carried out on a hotplate, in a convection oven, by IR radiation, UV radiation or microwaves.

6. A process according to claim 1, wherein local heating is carried out using a laser.

7. A process according to claim 1, for the production of solar cells with two-stage emitters.

8. A process according to claim 2, comprising heating to temperatures in the range from about 800 to 1050° C.

9. A process according to claim 6, wherein said laser is an IR laser.

10. A process for the etching of passivation and antireflection layers of silicon nitride on solar cells, comprising
    (a) applying a printable paste etching medium in a single process step, over the entire surface or selectively to the surface regions to be etched, and
    (b) heating the entire surface or the surface regions to be etched to 250 to 350° C. for from 30 to 120 seconds,
wherein said printable paste etching medium comprises an etchant component consisting essentially of phosphoric acid or a salt thereof and 1-20% by weight of a thickener, based on the total weight of the etching paste.

* * * * *